(12) United States Patent
Majhi et al.

(10) Patent No.: US 10,439,134 B2
(45) Date of Patent: Oct. 8, 2019

(54) TECHNIQUES FOR FORMING NON-PLANAR RESISTIVE MEMORY CELLS

(71) Applicant: INTEL CORPORATION, Santa Clara, CA (US)

(72) Inventors: Prashant Majhi, San Jose, CA (US); Elijah V. Karpov, Santa Clara, CA (US); Uday Shah, Portland, OR (US); Niloy Mukherjee, Portland, OR (US); Charles C. Kuo, Hillsboro, OR (US); Ravi Pillarisetty, Portland, OR (US); Brian S. Doyle, Portland, OR (US); Robert S. Chau, Beaverton, OR (US)

(73) Assignee: INTEL CORPORATION, Santa Clara, CA (US)

( * ) Notice: Subject to any disclaimer, the term of this patent is extended or adjusted under 35 U.S.C. 154(b) by 0 days.

(21) Appl. No.: 15/117,594

(22) PCT Filed: Mar. 25, 2014

(86) PCT No.: PCT/US2014/031735
§ 371 (c)(1),
(2) Date: Aug. 9, 2016

(87) PCT Pub. No.: WO2015/147801
PCT Pub. Date: Oct. 1, 2015

(65) Prior Publication Data
US 2016/0359108 A1    Dec. 8, 2016

(51) Int. Cl.
*H01L 45/00* (2006.01)
*H01L 27/24* (2006.01)

(52) U.S. Cl.
CPC .......... *H01L 45/08* (2013.01); *H01L 27/2409* (2013.01); *H01L 27/2436* (2013.01);
(Continued)

(58) Field of Classification Search
CPC ...... H01L 45/04; H01L 45/06; H01L 45/1608
See application file for complete search history.

(56) References Cited

U.S. PATENT DOCUMENTS

| | | | | |
|---|---|---|---|---|
| 8,206,995 B2 * | 6/2012 | Reyes | ..................... | H01L 45/04 257/295 |
| 2010/0110758 A1 * | 5/2010 | Li | ..................... | G11C 13/0007 365/148 |

(Continued)

FOREIGN PATENT DOCUMENTS

| CN | 102484114 A | 5/2012 |
|---|---|---|
| JP | 2010153868 A | 7/2010 |

(Continued)

OTHER PUBLICATIONS

International Search Report and Written Opinion as received for Patent Application No. PCT/US2014/031735, dated Dec. 23, 2014, 13 pages.

(Continued)

*Primary Examiner* — Julia Slutsker
(74) *Attorney, Agent, or Firm* — Finch & Maloney PLLC

(57) ABSTRACT

Techniques are disclosed for forming non-planar resistive memory cells, such as non-planar resistive random-access memory (ReRAM or RRAM) cells. The techniques can be used to reduce forming voltage requirements and/or resistances involved (such as the resistance during the low-resistance state) relative to planar resistive memory cells for a given memory cell space. The non-planar resistive memory cell includes a first electrode, a second electrode, and a switching layer disposed between the first and second electrodes. The second electrode may be substantially between opposing portions of the switching layer, and the first electrode may be substantially adjacent to at least two sides of the switching layer, after the non-planar resistive memory cell is formed. In some cases, an oxygen exchange (Continued)

layer (OEL) may be disposed between the switching layer and one of the first and second electrodes to, for example, increase flexibility in incorporating materials in the cell.

21 Claims, 11 Drawing Sheets

(52) U.S. Cl.
CPC ........ *H01L 45/122* (2013.01); *H01L 45/1233* (2013.01); *H01L 45/1253* (2013.01); *H01L 45/146* (2013.01); *H01L 45/147* (2013.01); *H01L 45/16* (2013.01); *H01L 45/1683* (2013.01)

(56) References Cited

U.S. PATENT DOCUMENTS

| | | | |
|---|---|---|---|
| 2011/0140068 A1 | 6/2011 | Ozawa et al. | |
| 2011/0155989 A1 | 6/2011 | Park et al. | |
| 2011/0210301 A1 | 9/2011 | Nansei | |
| 2012/0305877 A1 | 12/2012 | Ju et al. | |
| 2013/0009122 A1 | 1/2013 | Park et al. | |
| 2013/0069031 A1 | 3/2013 | Huang et al. | |
| 2013/0119337 A1* | 5/2013 | Kang | H01L 27/2409 257/2 |
| 2013/0193397 A1 | 8/2013 | Lin et al. | |
| 2013/0200326 A1 | 8/2013 | Ju et al. | |
| 2014/0042380 A1* | 2/2014 | Kim | H01L 45/145 257/2 |
| 2014/0264234 A1* | 9/2014 | Tu | H01L 45/146 438/382 |
| 2015/0103583 A1* | 4/2015 | Tada | G11C 13/0002 365/148 |

FOREIGN PATENT DOCUMENTS

| | | |
|---|---|---|
| JP | 2010212541 A | 9/2010 |
| JP | WO2013136798 A1 | 8/2015 |
| KR | 101328506 B1 | 11/2013 |
| WO | 2015147801 A1 | 10/2015 |

OTHER PUBLICATIONS

International Preliminary Report on Patentability received for Patent Application No. PCT/US2014/031735, dated Oct. 6, 2016, 10 pages.

Extended European Search Report received for EP Application No. 14887288.8, dated Oct. 20, 2017. 8 pages.

Chen, et al., "HfOx Based Vertical Resistive Random Access Memory for Cost-Effective 3D Cross-Point Architecture without Cell Selector," IEEE, 20.7.1. pp. IEDM12-497-IEDM12-500.

\* cited by examiner

TECHNIQUES FOR FORMING NON-PLANAR RESISTIVE MEMORY CELLS

BACKGROUND

Resistive memory, such as resistive random-access memory (ReRAM or RRAM), generally includes a two-terminal device in which a comparatively insulating switching layer or medium is positioned between two conductive electrodes. ReRAM devices typically consist of one transistor (1T) or one diode (1D) along with one resistor (1R), resulting in 1T1R or 1D1R configurations. ReRAM can change between two different states: a high-resistance state (HRS), which may be representative of an off or 0 state; and a low-resistance state (LRS), which may be representative of an on or 1 state. Typically, a reset process is used to switch the ReRAM device to the HRS using a reset voltage, and a set process is used to switch the ReRAM device to the LRS using a set voltage. Filamentary ReRAM requires an initial forming process whereby a high voltage stress (known as a forming voltage) is applied to the device. Interfacial ReRAM does not require such an initial forming process.

DETAILED DESCRIPTION

Techniques are disclosed for forming non-planar resistive memory cells, such as non-planar resistive random-access memory (ReRAM or RRAM) cells. The techniques can be used to reduce forming voltage requirements and/or resistances involved (such as the resistance during the low-resistance state) relative to planar resistive memory cells for a given memory cell space. The non-planar resistive memory cell includes a first electrode, a second electrode, and a switching layer disposed between the first and second electrodes. The second electrode may be substantially between opposing portions of the switching layer, and the first electrode may be substantially adjacent to at least two sides of the switching layer, after the non-planar resistive memory cell is formed. In some cases, an oxygen exchange layer (OEL) may be disposed between the switching layer and one of the first and second electrodes to, for example, increase flexibility in incorporating materials in the cell. The non-planar resistive memory cells may be used with various configurations, such as 1T1R, 1D1R, and cross-point configurations. Numerous configurations and variations will be apparent in light of this disclosure.

General Overview

Figure 1:
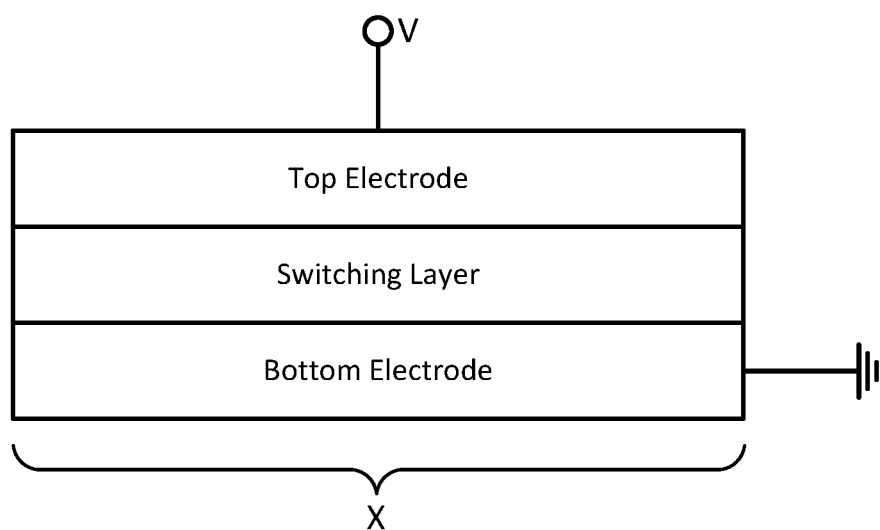
FIG. 1 illustrates a planar resistive memory cell, such as a planar resistive random-access memory (ReRAM) cell.

As previously explained, resistive random-access memory (ReRAM or RRAM) is generally a two-terminal device in which a comparatively insulating switching layer or medium is positioned between two conductive electrodes. FIG. 1 illustrates a planar resistive memory cell, such as a planar ReRAM cell, having width X. As shown, the planar ReRAM cell includes a grounded bottom electrode, a top electrode connected to a voltage source V, and a switching layer (e.g., a metal oxide layer) positioned between the electrodes. The voltage source may be supplied, for example, by a transistor in a 1T1R configuration or a diode in a 1D1R configuration. Scaling the size of planar ReRAM cells causes significant issues. Some issues arise because the width afforded to planar ReRAM cells decrease with increased scaling of ReRAM devices (i.e., as the devices get smaller). For example, reducing the size of conventional planar ReRAM cells results in an undesired increase in forming voltage (V) in the case of, for example, filamentary ReRAM. In addition, reducing the size of conventional planar ReRAM cells results in an undesired increase in resistance during the low-resistance state (LRS) in the case of, for example, interfacial ReRAM.

Thus, and in accordance with one or more embodiments of the present disclosure, techniques are disclosed for forming non-planar resistive memory cells, such as non-planar ReRAM cells. As previously described, the width afforded to ReRAM decreases as scaling of the ReRAM device decreases. Therefore an increase in effective cell area can be gained from a non-planar resistive memory cell configuration. The increase in effective cell area can provide the benefits of at least a reduction in forming voltage (e.g., for filamentary ReRAM) and/or a reduction in the resistances involved, such as a reduction in the resistance during the LRS (e.g., for interfacial ReRAM). The non-planar resistive memory cells, as variously described herein, may be used with numerous configurations, such as 1T1R, 1D1R, cross-point, and/or any other suitable configuration, as will be apparent in light of this disclosure.

In some embodiments, the non-planar memory cell may include a first electrode, a second electrode, and a switching layer disposed between the first and second electrodes. In some such embodiments, the second electrode may be substantially between opposing portions of the switching layer, and the first electrode may be substantially adjacent to at least two sides of the switching layer. The term "substantially adjacent" as used herein in the context of two layers means being within at least two layers of each other, such that one non-similar layer may be disposed between two layers that are substantially adjacent to each other. For example, in some embodiments, an oxygen exchange layer (OEL) may be disposed between the switching layer and one of the first and second electrodes (e.g., to increase flexibility in incorporating materials in the cell).

In some embodiments, the first electrode and switching layer may make a two-layered cup-like shape, where the cup is filled with a second electrode. In other words, cup may have bottom, left, and right sides, such that a first electrode cup is filled with a switching layer cup, and the switching layer cup is filled with a second electrode. In some such embodiments, three-first electrode/switching layer/second electrode interfaces are formed, leading to an increase in the effective cell area of the resistive memory cell. Further, in some such embodiments, an OEL may be included in the cup structure, such as another cup between the first electrode cup and switching layer cup, or between the switching layer cup and the second electrode, depending upon the configuration of the memory cell.

In some embodiments, the inside sides of the switching layer may be disposed on opposite sides of the second electrode and the first electrode may be disposed on the outside sides of the switching layer. In other words, the cell may have a first electrode/switching layer/second electrode/switching layer/first electrode sandwich structure, as will be apparent in light of this disclosure. In some such embodiments, two-first electrode/switching layer/second electrode interfaces are formed, leading to an increase in the effective cell area of the resistive memory cell. Further, in some such embodiments, an OEL may be included in the sandwich structure, such as between the first electrode layers and switching layers, or between the switching layers and second electrode, depending upon the configuration of the memory cell.

Upon analysis (e.g., using scanning/transmission electron microscopy (SEM/TEM) and/or composition mapping), a structure configured in accordance with one or more embodiments will effectively show a non-planar resistive memory cell as variously described herein. In addition, the forming voltage requirements of such non-planar resistive memory cells (e.g., for filamentary ReRAM) can be compared to planar resistive memory cells occupying the same space to measure the benefit in forming voltage requirements achieved by using non-planar resistive memory cells as variously described herein. Further, the resistances involved with the cell, such as the LRS, with such non-planar resistive memory cells (e.g., for interfacial ReRAM) can be compared to planar resistive memory cells occupying the same space to measure the benefit in resistances achieved by using non-planar resistive memory cells as variously described herein. Numerous configurations and variations will be apparent in light of this disclosure.

Architecture and Methodology

Figure 2:
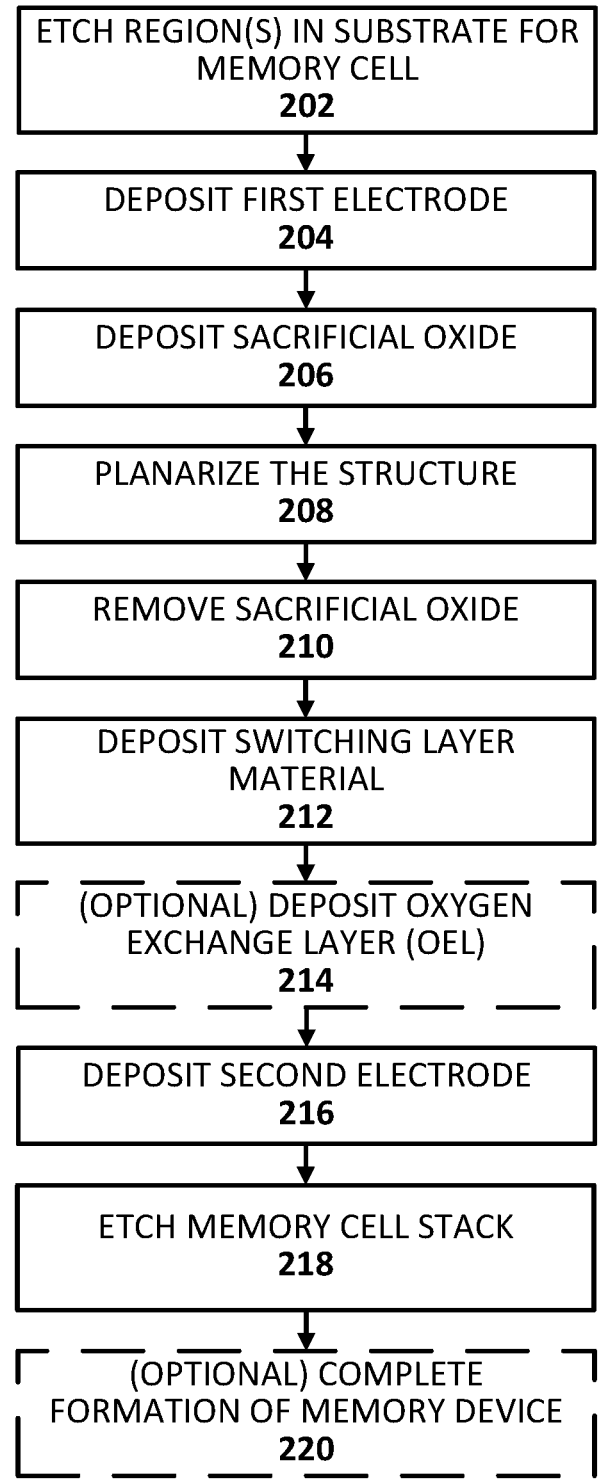
FIG. 2 illustrates a method of forming an integrated circuit, in accordance with one or more embodiments of the present disclosure.

FIG. 2 illustrates a method 200 of forming an integrated circuit, in accordance with one or more embodiments of the present disclosure. FIGS. 3A-J illustrate example structures that are formed when carrying out method 200 of FIG. 2, in accordance with various embodiments. Although the techniques disclosed herein are primarily illustrated and described in the context of resistive memory, such as resistive random-access memory (ReRAM or RRAM), similar principles and techniques as variously described herein may be used for other integrated circuit structures. The non-planar resistive memory cell structures may be used with various configurations, such as 1T1R, 1D1R, cross-point, and/or any other suitable configuration. In other words, the techniques described herein can be used in any suitable structure or device that would benefit from the use of non-planar resistive memory cells, as will be apparent in light of this disclosure.

Figure 3A:
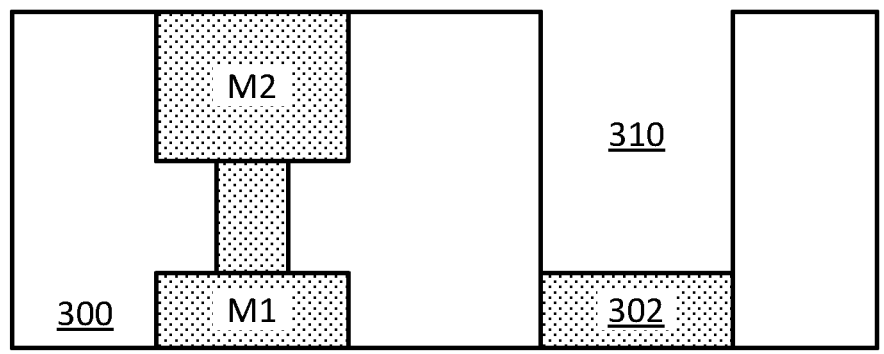
FIGS. 3A-J illustrate example structures that are formed when carrying out the method of FIG. 2, in accordance with various embodiments.

As can be seen in FIG. 2, method 200 includes etching 202 (or otherwise removing) one or more regions in a substrate for the formation of non-planar resistive memory cells. FIG. 3A shows an example resulting structure after etch 202 has been performed to create open region 310 in a substrate. In the example structure shown, the substrate includes two levels of interconnects M1 and M2, as well as interconnect 302, all surrounded by dielectric layer 300. Interconnects M1, M2, and 302 can be formed of any suitable electrically conductive material (or combination of materials), using any suitable technique (such as any suitable metallization process), and the dimensions of interconnects M1, M2, and 302 can be customized as desired for a given target application or end use. For example, in some cases, interconnects M1, M2, and 302 may comprise copper (Cu), cobalt (Co), molybdenum (Mo), rhodium (Rh), beryllium (Be), chromium (Cr), manganese (Mn), aluminum (Al), silver (Ag), gold (Au), titanium (Ti), indium (In), ruthenium (Ru), palladium (Pd), tungsten (W), and/or nickel (Ni). Dielectric 300 can be formed from any suitable dielectric or insulator material (or combination of such materials), using any suitable technique. For example, in some cases, dielectric 300 may comprise an insulating oxide such as silicon dioxide ($SiO_2$) or carbon doped oxide (CDO), silicon nitride, organic polymers such as perfluorocyclobutane or polytetrafluoroethylene, fluorosilicate glass (FSG), and/or organosilicates such as silsesquioxane, siloxane, or organosilicate glass.

With further reference to FIG. 3A, although only one open region 310 is shown in this example embodiment, numerous open regions may be created to allow for numerous resistive memory cells (e.g., hundreds, thousands, millions, billions, etc.), as will be apparent in light of this disclosure. Etch 202 may be performed using any suitable etching techniques and may include any number of suitable patterning processes. For example, etch 202 may include a dry etch performed to create the deep open region 310 that allows for the formation of a non-planar resistive memory cell as will be discussed in more detail below. Note that open region 310 is completely over interconnect 302; however, that need not be the case.

Figure 3B:
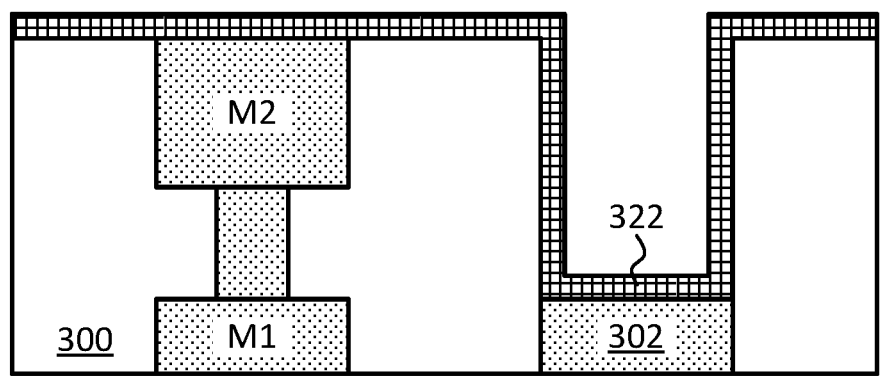

Method 200 continues with depositing 204 first electrode layer 322, to form the example resulting structure shown in FIG. 3B, in accordance with an embodiment. Deposition 204 may be performed using any suitable technique, such as: a physical vapor deposition (PVD) process, such as sputter deposition; a chemical vapor deposition (CVD) process; atomic layer deposition (ALD) process; plasma-enhanced ALD (PEALD); and/or a molecular beam epitaxy (MBE) process. In this example embodiment, deposition 204 is a conformal deposition process (e.g., a conformal CVD or ALD process) used to achieve a sufficiently consistent thickness of first electrode layer 322 over an uneven/non-planar structure (e.g., as is the case in FIG. 3B). However, the present disclosure need not be so limited. In some cases, deposition 204 may be a low temperature deposition process, such as a process having a maximum temperature of 500, for example. In some such cases, the processing thermal budget constraints may be dependent on the interconnect material used, to prevent damage to the interconnects (such as interconnect 302).

Figure 3C:
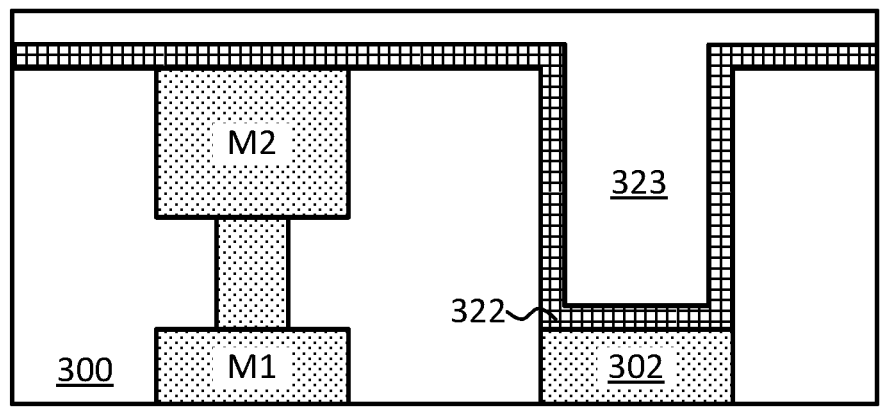
Figure 3D:
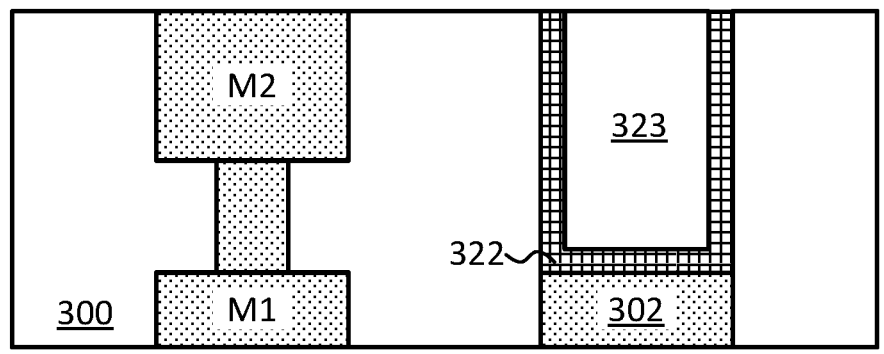

Method 200 continues with depositing 206 sacrificial oxide layer 323, to form the example resulting structure shown in FIG. 3C, in accordance with an embodiment. Deposition 206 may be performed using the example techniques previously discussed (e.g., PVD, CVD, ALD, PEALD, MBE, etc.), or using any other suitable technique. Method 200 continues with planarizing 208 the structure of FIG. 3C, to form the example resulting structure shown in FIG. 3D, in accordance with an embodiment. Planarizing 208 may be performed using any suitable technique, such as chemical-mechanical planarization (CMP), for example. Sacrificial oxide 323 may be used, in this example embodiment, to protect first electrode layer 322 during planarizing process 208. Sacrificial oxide layer 323 may comprise any suitable material as will be apparent in light of this disclosure, such as silicon oxide ($SiO_x$), for example.

Figure 3E:
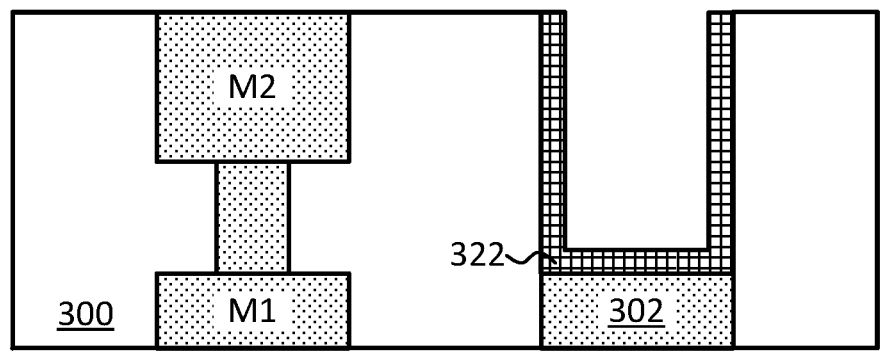
Figure 3F:
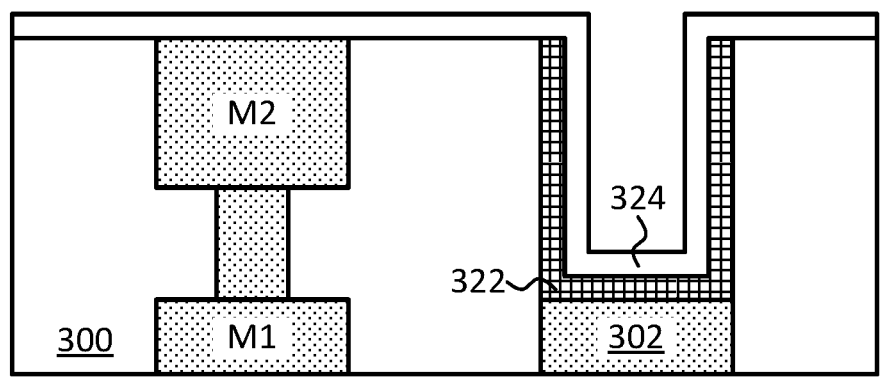

Method 200 continues with removing 210 sacrificial oxide 323, to form the example resulting structure shown in FIG. 3E, in accordance with an embodiment. Removing 210 sacrificial oxide 323 may be performed using any suitable technique, such as any suitable etch and any suitable patterning process. Method 200 continues with depositing 212 switching layer material 324, to form the example resulting structure shown in FIG. 3F, in accordance with an embodiment. Deposition 212 may be performed using the example techniques previously discussed (e.g., PVD, CVD, ALD, PEALD, MBE, etc.), or using any other suitable technique. In this example embodiment, deposition 212 is a conformal deposition process (e.g., a conformal CVD or ALD process) used to achieve a sufficiently consistent thickness of switching layer material 324 over an uneven/non-planar structure (e.g., as is the case in FIG. 3F). However, the present disclosure need not be so limited.

Figure 3G:
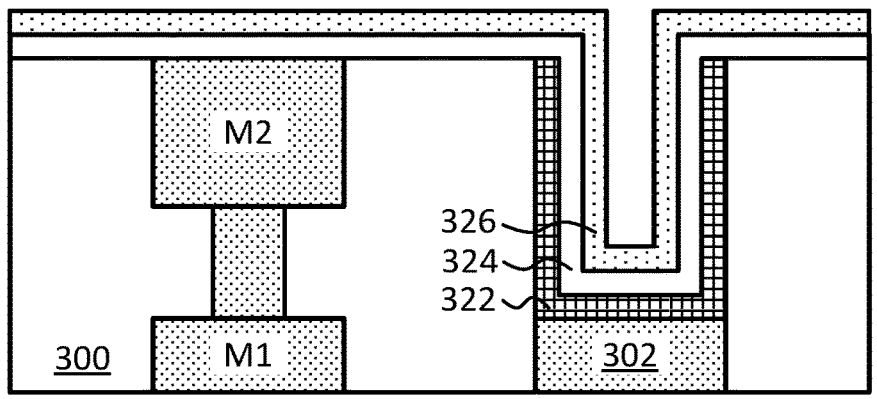
Figure 3H:
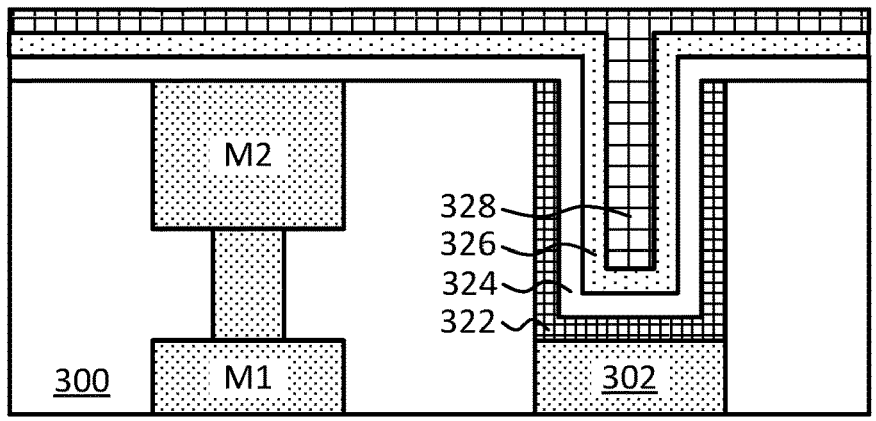

Method 200 continues with optionally depositing 214 oxygen exchange layer (OEL) 326, to form the example resulting structure shown in FIG. 3G, in accordance with an embodiment. In some cases, OEL 326 may increase flexibility in incorporating the other materials in the memory cell, as will be apparent in light of this disclosure. Method 200 continues with depositing 216 second electrode layer 328, to form the example resulting structure shown in FIG. 3H, in accordance with an embodiment. Depositions 214, 216 may be performed using the example techniques previously discussed (e.g., PVD, CVD, ALD, PEALD, MBE, etc.), or using any other suitable technique. In this example embodiment, deposition 214 is a conformal deposition process (e.g., a conformal CVD or ALD process) used to achieve a sufficiently consistent thickness of OEL 326 over an uneven/non-planar structure (e.g., as is the case in FIG. 3G). Deposition 216 may be followed by a planarization process (e.g., using a CMP process) to form the planar structure shown in FIG. 3H, in some example cases.

Figure 3I:
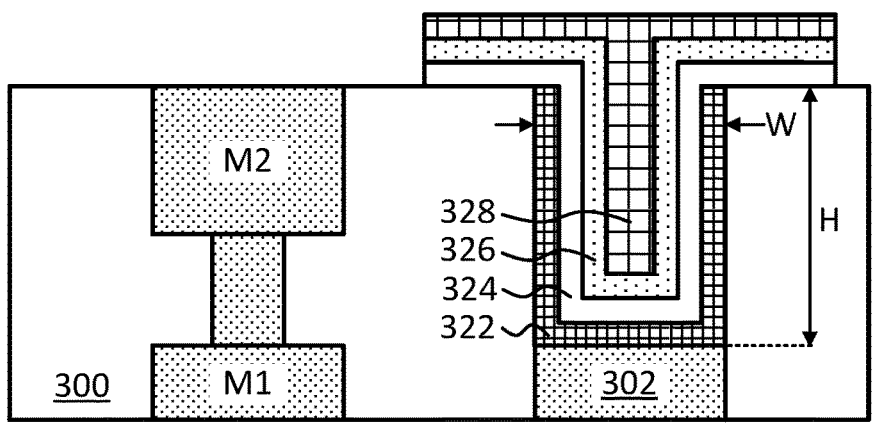

Method 200 continues with etching 218 the memory cell stack, to form the example resulting structure shown in FIG. 3I, in accordance with an embodiment. Etch 218 may be performed using any suitable etching techniques and may include any number of suitable patterning processes. The memory cell stack shown in FIG. 3I is a non-planar resistive memory cell stack, in this example embodiment, and includes first electrode 322, switching layer 324, optional oxygen exchange layer (OEL) 326, and second electrode 328.

In this example embodiment, the non-planar resistive memory cell has a rectangular shape having a width W and a height H, as indicated in FIG. 3I. Further, the non-planar cell has a width W and a height H as indicated in FIG. 3I. In this manner, the non-planar cell increases effective cell area compared to, for example, a planar resistive memory cell occupying the same cell width W (an example of a planar resistive memory cell is depicted FIG. 1). In some embodiments, the non-planar resistive memory cell may have a height H to width W ratio (H:W) of at least 1, 2, 5, 10, 20, or at least some other suitable ratio amount, as will be apparent in light of this disclosure. Therefore, effective cell area increase of the non-planar cell may be, relative to a planar cell occupying the same space, at least 1.5×, 2×, 5×, 10×, 20×, or some other suitable amount, as will be apparent in light of this disclosure. Note that switching layer 324, optional OEL 326, and second electrode 328 extend above and beyond the memory cell in this example embodiment, to assist with the contact between interconnect 304 and second electrode 328, as will be discussed in more detail below. Also note that in the non-planar cell, second electrode 328 is surrounded by or substantially between opposing portions of switching layer 324. Further note that, in this example embodiment, first electrode 322 is substantially adjacent to (and in this example case, physically contacting) three sides of switching layer 324 (e.g., the bottom and left and right sides). Recall that OEL 326 is optional and that in embodiments where OEL 326 is absent, switching layer 324 may make direct contact with both first and second electrodes 322 and 328. The example structure shown in FIG. 3I is provided for illustrative purposes and is not intended to limit the present disclosure.

In some embodiments, first and second electrodes 322 and 328 may each comprise at least one of: disulfur dinitride ($S_2N_2$); titanium nitride (TiN); tantalum nitride (TaN); copper (Cu); tungsten (W); titanium (Ti); one or more noble metals, such as ruthenium (Ru), rhodium (Rh), palladium (Pd), silver (Ag), osmium (Os), iridium (Ir), platinum (Pt), and gold (Au); and/or any other suitable material or combination of materials. In some embodiments, first and second electrodes 322 and 328 may each have a thickness in the range of 5-100 nm, or any other suitable thickness or thickness range. In some embodiments, switching layer 324 may comprise at least one of: a metal oxide, such as hafnium oxide ($HfO_x$), titanium oxide ($TiO_x$), nitrogen oxide ($NiO_x$), tungsten oxide ($WO_x$), tantalum oxide ($TaO_x$), zirconium oxide ($ZiO_x$) vanadium oxide ($VO_x$), copper oxide ($CuO_x$), aluminum oxide ($AlO_x$); a metal oxide alloy; and/or any other suitable material or combination of materials. In some embodiments, switching layer 324 may have a thickness in the range of 2-10 nm, or any other suitable thickness or thickness range. In some embodiments, optional oxygen exchange layer (OEL) 326, when present, may comprise at least one of: hafnium (Hf); titanium (Ti); tantalum (Ta); and/or any other suitable material or combination of materials. In some embodiments, optional OEL 326, when present, may have a thickness in the range of 2-10 nm, or any other suitable thickness or thickness range.

Figure 3J:
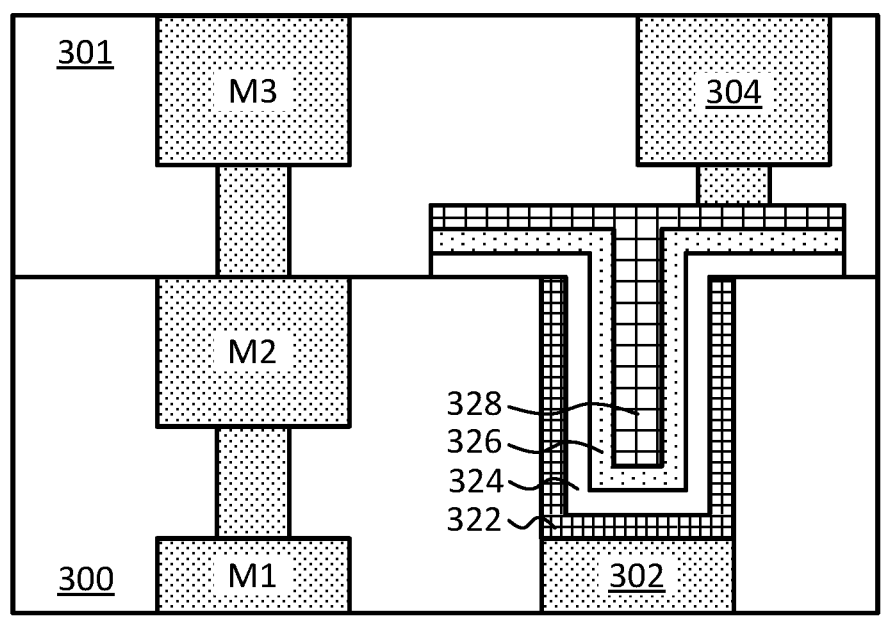

Method 200 continues with optionally completing formation 220 of the memory device, to form the example resulting structure shown in FIG. 3J, in accordance with an embodiment. In this example embodiment, another interconnect level M3 has been formed, including interconnect 304 (in contact with second electrode 328) and dielectric layer 301 as shown. Any suitable process, such as a metallization process (which may include alignment), may be used to form the structure as shown. The previous discussion with respect to interconnect 302 and dielectric 300 apply, respectively, to interconnect 304 and dielectric 301. Note, as previously described, switching layer 324, optional OEL 326, and second electrode 328 extend above and beyond the memory cell in this example embodiment, to assist with the contact between interconnect 304 and second electrode 328. For example, 324, 326, and 328 may be extended to provide a larger area for contact between interconnect 304 and second electrode layer 328.

In some embodiments, first electrode 322 may be a bottom electrode that is electrically grounded (e.g., via interconnect 302) and second electrode 328 may be a top electrode that is electrically connected to a voltage source (e.g., via interconnect 304). In some such embodiments, second/top electrode 328 may be electrically connected to a transistor (e.g., in a 1T1R architecture/configuration) or a diode (e.g., in a 1D1R architecture/configuration). In other embodiments, first electrode 322 may be the top electrode/electrically connected to a voltage source and second electrode 328 may be the bottom electrode/electrically grounded. In some such embodiments, the position of switching layer 324 optional OEL 326 (when present) may be interchanged (e.g., to make a 322/326/324/328 cell). Numerous variations and configurations will be apparent in light of this disclosure.

Figure 4:
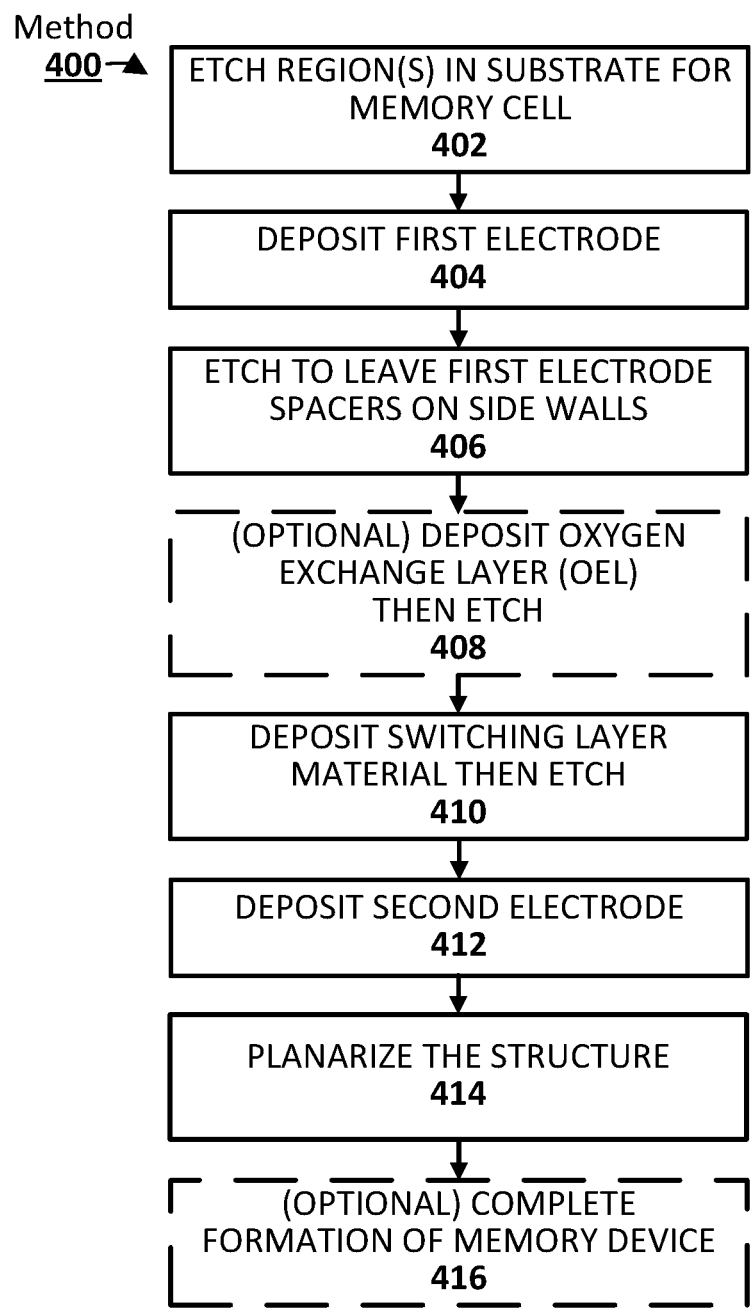
FIG. 4 illustrates a method of forming an integrated circuit, in accordance with one or more embodiments of the present disclosure.

FIG. 4 illustrates a method 400 of forming an integrated circuit, in accordance with one or more embodiments of the present disclosure. FIGS. 5A-H illustrate example structures that are formed when carrying out method 400 of FIG. 4, in accordance with various embodiments. The previous discuss above with respect to FIGS. 2 and 3A-J is equally applicable here, as will be appreciated. Similar numbering is used to identify the features in FIGS. 5A-H as was used in FIGS. 3A-J, except that FIGS. 5A-H include numbering in the 500s, whereas FIGS. 3A-J include numbering in the 300s (e.g., interconnect 502 is similar to interconnect 302, switching layer 524 is similar to switching layer 324, etc.). Therefore, only the differences between the embodiments in FIGS. 4 and 5A-H relative to FIGS. 2 and 3A-J will primarily be discussed.

Figure 5A:
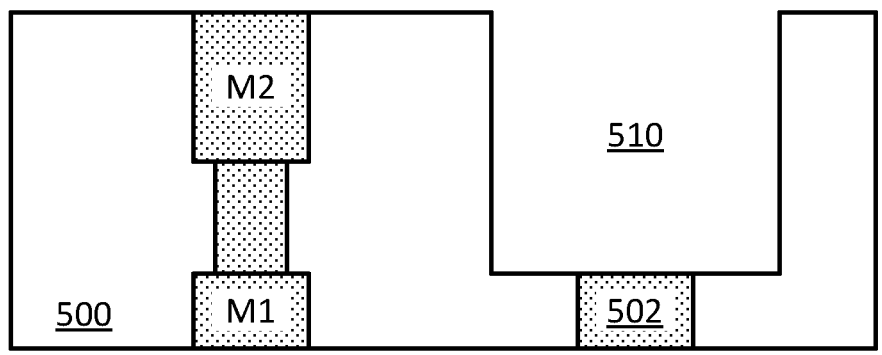
FIGS. 5A-H illustrate example structures that are formed when carrying out the method of FIG. 4, in accordance with various embodiments.

As can be seen in FIG. 4, method 400 includes etching 402 (or otherwise removing) one or more regions in a substrate for the formation of non-planar resistive memory cells. The previous discussion with respect to such an etch is equally applicable here. FIG. 5A shows an example resulting structure after etch 402 has been performed to create open region 510 in a substrate. In the example structure shown, the substrate includes two levels of interconnects M1 and M2, as well as interconnect 502, all surrounded by dielectric layer 500. The previous discussion with respect to the interconnects and dielectric is equally applicable here. Note, in the example embodiment shown in FIG. 5A, open region 510 extends beyond interconnect 502 (e.g., compare to FIG. 3A where open region 310 is completely over interconnect 302). Further note that the space that open region 510 extends beyond interconnect 502 can be used to ensure that only one electrode is in contact with interconnect 502, as will be discussed in more detail below.

Figure 5B:
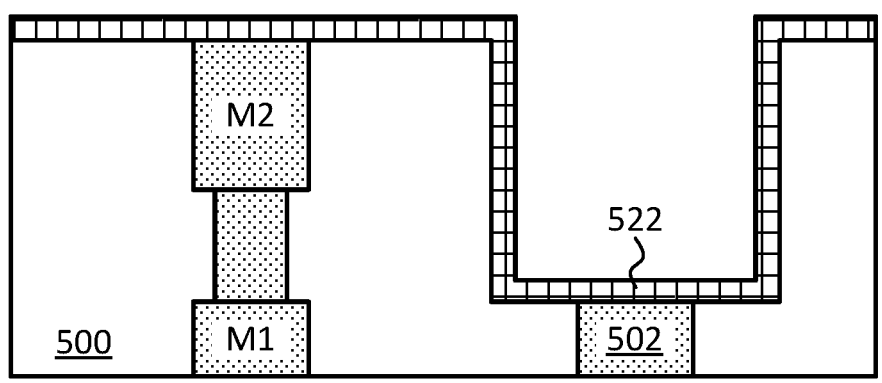
Figure 5C:
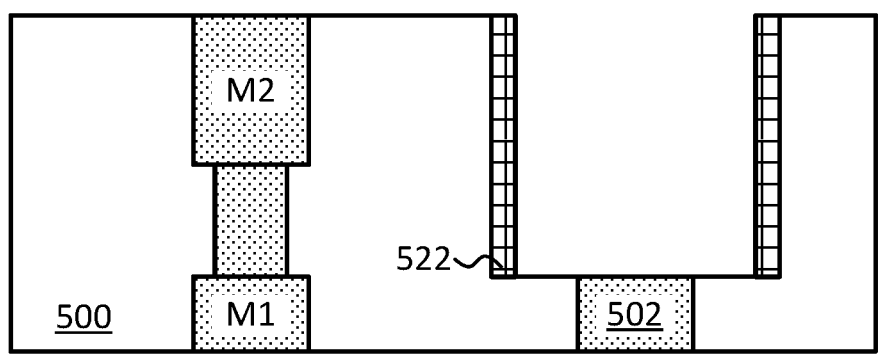

Method 400 continues with depositing 404 first electrode layer 522, to form the example resulting structure shown in FIG. 5B, in accordance with an embodiment. The previous discussion with respect to the first electrode layer, and the deposition thereof, is equally applicable here. Method 400 continues with etching 406 first electrode layer 522, to form the example resulting structure shown in FIG. 5C, in accordance with an embodiment. Etch 406 may be performed using any suitable etching techniques and may include any number of suitable patterning processes. In this example embodiment, etch 406 is a blanket etch performed to leave first electrode 522 spacers on the side walls of open region 510, as seen in FIG. 5C.

Figure 5D:
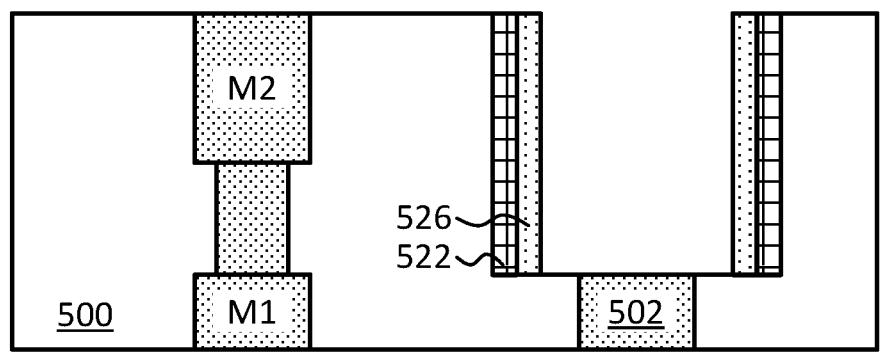
Figure 5E:
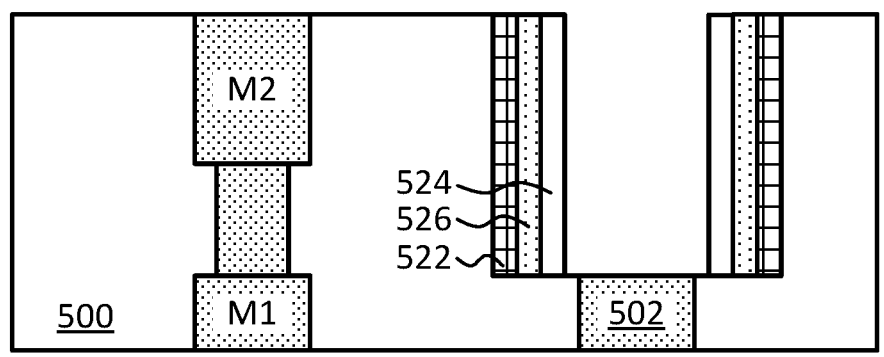

Method 400 continues with optionally depositing and etching 408 oxygen exchange layer (OEL) 526, to form the resulting structure shown in FIG. 5D, in accordance with an embodiment. The previous discussion with respect to the OEL, and the deposition thereof, is equally applicable here. Etch 408 may be performed using any suitable etching techniques and may include any number of suitable patterning processes. In this example embodiment, etch 408 is a blanket etch performed to leave OEL 526 spacers on top of first electrode 522 spacers, as seen in FIG. 5D. Method 400 continues with depositing and etching 410 switching layer 524, to form the resulting structure shown in FIG. 5E, in accordance with an embodiment. The previous discussion with respect to the switching layer, and the deposition thereof, is equally applicable here. Etch 410 may be performed using any suitable etching techniques and may include any number of suitable patterning processes. In this example embodiment, etch 410 is a blanket etch performed to leave switching layer 524 spacers on top of OEL 526 spacers, as seen in FIG. 5E.

Figure 5F:
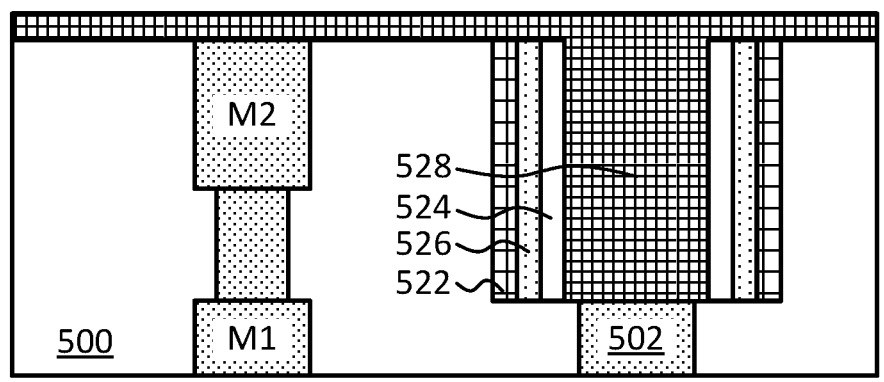
Figure 5G:
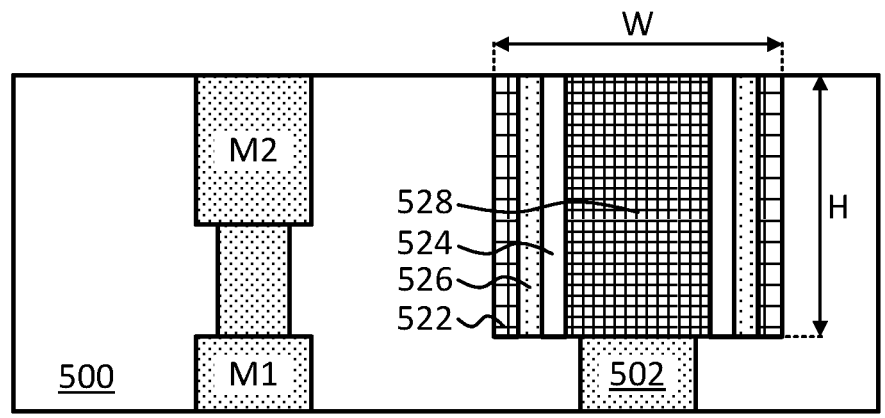

Method 400 continues with depositing 412 second electrode layer 528, to form the example resulting structure shown in FIG. 5F, in accordance with an embodiment. The previous discussion with respect to the second electrode layer, and the deposition thereof, is equally applicable here. Method 400 continues with planarizing 414 the structure of FIG. 5F, to form the example resulting structure shown in FIG. 5G, in accordance with an embodiment. Planarizing 414 may be performed using any suitable technique, such as chemical-mechanical planarization (CMP), for example. The memory cell stack shown in FIG. 5G is a non-planar resistive memory cell stack, in this example embodiment, and includes first electrode 522, optional oxygen exchange layer (OEL) 526, switching layer 524, and second electrode 528. The previous discussion with respect to the non-planar resistive memory cell stack is equally applicable here. For example, note that in the non-planar cell, second electrode 528 is surrounded by or substantially between opposing portions of switching layer 524. Further note that, in this example embodiment, first electrode 522 is substantially adjacent to two sides of switching layer 524 (e.g., the left and right sides). Recall that OEL 526 is optional and that in embodiments where OEL 526 is absent, switching layer 524 may make direct contact with both first and second electrodes 522 and 528. This example structure shown in FIG. 5G is provided for illustrative purposes and is not intended to limit the present disclosure.

Figure 5H:
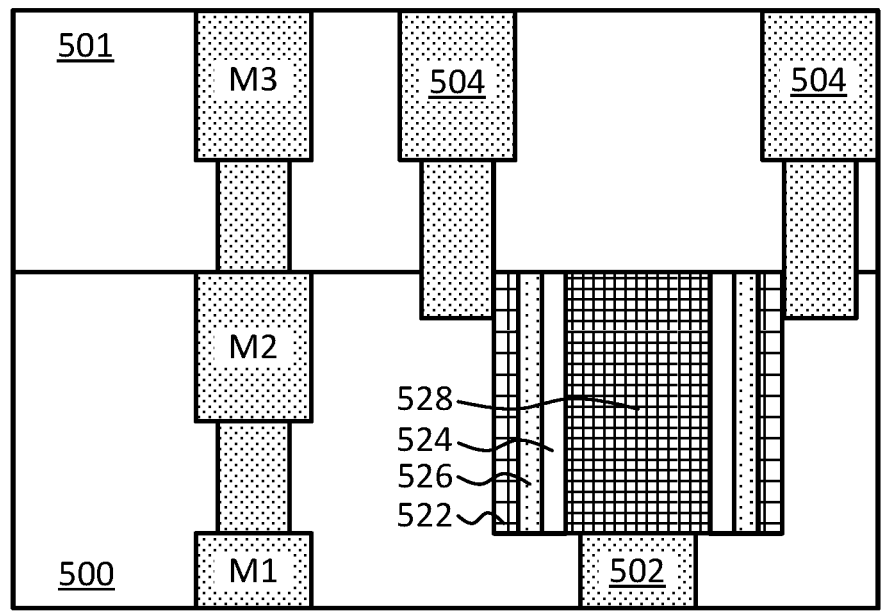

Method 400 continues with optionally completing formation 416 of the memory device, to form the example resulting structure shown in FIG. 5H, in accordance with an embodiment. In this example embodiment, another interconnect level M3 has been formed, including interconnects 504 (in contact with first electrode 522) and dielectric layer 501 as shown. Any suitable process, such as a metallization process (which may include alignment), may be used to form the structure as shown. The previous discussion with respect to interconnect 502 and dielectric 500 apply, respectively, to interconnects 504 and dielectric 501. Note that two interconnects 504 are shown in this example embodiment to make contact to both sides of first electrode 522.

In some embodiments, first electrode 522 may be a top electrode that is electrically connected to a voltage source (e.g., via interconnects 504) and second electrode 528 may be a bottom electrode that is electrically grounded (e.g., via interconnect 502). In some such embodiments, first/top electrode 522 may be electrically connected to a transistor (e.g., in a 1T1R architecture/configuration) or a diode (e.g., in a 1D1R architecture/configuration). In other embodiments, second electrode 528 may be the top electrode/ electrically connected to a voltage source and first electrode 522 may be the bottom electrode/electrically grounded. In some such embodiments, the position of switching layer 524 optional OEL 526 (when present) may be interchanged (e.g., to make a 522/524/526/528 cell). Numerous variations and configurations will be apparent in light of this disclosure.

Example System

Figure 6:
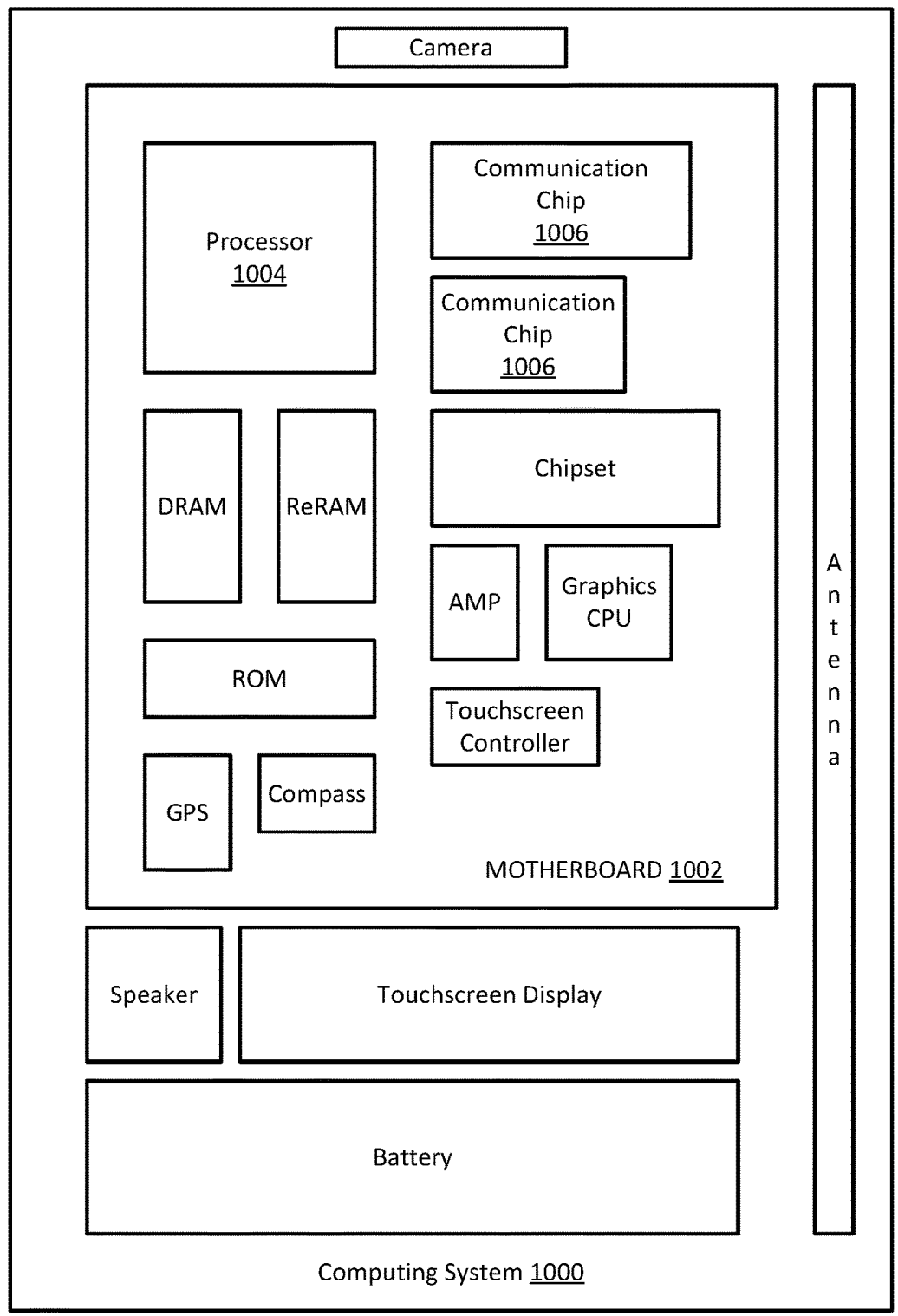
FIG. 6 illustrates a computing system implemented with integrated circuit structures or devices formed using the techniques disclosed herein, in accordance with an example embodiment.

FIG. 6 illustrates a computing system 1000 implemented with integrated circuit structures or devices formed using the techniques disclosed herein, in accordance with an example embodiment. As can be seen, the computing system 1000 houses a motherboard 1002. The motherboard 1002 may include a number of components, including, but not limited to, a processor 1004 and at least one communication chip 1006, each of which can be physically and electrically coupled to the motherboard 1002, or otherwise integrated therein. As will be appreciated, the motherboard 1002 may be, for example, any printed circuit board, whether a main board, a daughterboard mounted on a main board, or the only board of system 1000, etc.

Depending on its applications, computing system 1000 may include one or more other components that may or may not be physically and electrically coupled to the motherboard 1002. These other components may include, but are not limited to, volatile memory (e.g., DRAM), non-volatile memory (e.g., ROM, ReRAM, etc.), a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth). Any of the components included in computing system 1000 may include one or more integrated circuit structures or devices (e.g., one or more non-planar resistive memory cells) formed using the disclosed techniques in accordance with an example embodiment. In some embodiments, multiple functions can be integrated into one or more chips (e.g., for instance, note that the communication chip 1006 can be part of or otherwise integrated into the processor 1004).

The communication chip 1006 enables wireless communications for the transfer of data to and from the computing system 1000. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 1006 may implement any of a number of wireless standards or protocols, including, but not limited to, Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing system 1000 may include a plurality of communication chips 1006. For instance, a first communication chip 1006 may be dedicated to shorter range wireless communications such as Wi-Fi and Bluetooth and a second communication chip 1006 may be dedicated to longer range wireless communications such as GPS, EDGE, GPRS, CDMA, WiMAX, LTE, Ev-DO, and others.

The processor 1004 of the computing system 1000 includes an integrated circuit die packaged within the processor 1004. In some embodiments, the integrated circuit die of the processor includes onboard circuitry that is implemented with one or more integrated circuit structures or devices (e.g., one or more non-planar resistive memory cells) formed using the disclosed techniques, as variously described herein. The term "processor" may refer to any device or portion of a device that processes, for instance, electronic data from registers and/or memory to transform that electronic data into other electronic data that may be stored in registers and/or memory.

The communication chip 1006 also may include an integrated circuit die packaged within the communication chip 1006. In accordance with some such example embodiments, the integrated circuit die of the communication chip includes one or more integrated circuit structures or devices (e.g., one or more non-planar resistive memory cells) formed using the disclosed techniques as variously described herein. As will be appreciated in light of this disclosure, note that multi-standard wireless capability may be integrated directly into the processor 1004 (e.g., where functionality of any chips 1006 is integrated into processor 1004, rather than having separate communication chips). Further note that processor 1004 may be a chip set having such wireless capability. In short, any number of processor 1004 and/or communication chips 1006 can be used. Likewise, any one chip or chip set can have multiple functions integrated therein.

In various implementations, the computing device 1000 may be a laptop, a netbook, a notebook, a smartphone, a tablet, a personal digital assistant (PDA), an ultra-mobile PC, a mobile phone, a desktop computer, a server, a printer, a scanner, a monitor, a set-top box, an entertainment control unit, a digital camera, a portable music player, a digital video recorder, or any other electronic device that processes data or employs one or more integrated circuit structures or devices (e.g., one or more non-planar resistive memory cells) formed using the disclosed techniques, as variously described herein.

Further Example Embodiments

The following examples pertain to further embodiments, from which numerous permutations and configurations will be apparent.

Example 1 is a non-planar resistive memory cell, comprising: a first electrode disposed on opposing trench walls; a second electrode; and a switching layer disposed between the first and second electrodes; wherein the second electrode is substantially between opposing portions of the switching layer.

Example 2 includes the subject matter of claim 1, wherein the first electrode is substantially adjacent to at least two sides of the switching layer.

Example 3 includes the subject matter of any of claims 1-2, wherein the first electrode is substantially adjacent to three sides of the switching layer.

Example 4 includes the subject matter of any of claims 1-3, wherein the first electrode is electrically connected to a voltage source and the second electrode is electrically grounded.

Example 5 includes the subject matter of any of claims 1-4, wherein the first electrode is electrically grounded and the second electrode is connected to a voltage source.

Example 6 includes the subject matter of any of claims 1-5, wherein the first and second electrodes comprise at least one of disulfur dinitride ($S_2N_2$), titanium nitride (TiN), tantalum nitride (TaN), copper (Cu), tungsten (W), titanium (Ti), and/or one or more noble metals.

Example 7 includes the subject matter of any of claims 1-6, wherein the first and second electrodes each have a thickness in the range of 5-100 nm.

Example 8 includes the subject matter of any of claims 1-7, wherein the switching layer comprises at least one of a metal oxide and/or a metal alloy oxide.

Example 9 includes the subject matter of any of claims 1-8, wherein the switching layer has a thickness in the range of 2-10 nm.

Example 10 includes the subject matter of any of claims 1-9, further comprising an oxygen exchange layer (OEL) disposed between the switching layer and one of the first and second electrodes.

Example 11 includes the subject matter of claim 10, wherein the OEL comprises at least one of hafnium (Hf), titanium (Ti), and/or tantalum (Ta).

Example 12 includes the subject matter of any of claims 10-11, wherein the OEL has a thickness in the range of 2-10 nm.

Example 13 includes the subject matter of any of claims 1-12, wherein the effective area of the cell is increased compared to a planar resistive memory cell occupying the same space.

Example 14 includes the subject matter of any of claims 1-13, the cell having height and width dimensions, wherein the cell height is at least five times the cell width.

Example 15 includes the subject matter of any of claims 1-14, wherein one of the first and second electrodes is electrically connected to a transistor in a one transistor-one resistor (1T1R) architecture.

Example 16 includes the subject matter of any of claims 1-14, wherein one of the first and second electrodes is electrically connected to a diode in a one diode-one resistor (1D1R) architecture.

Example 17 is resistive random-access memory (ReRAM) comprising the subject matter of any of claims 1-16.

Example 18 is a method of forming an integrated circuit, the method comprising: etching a region in a substrate to form a first structure; depositing a first electrode layer over the first structure to form a second structure; depositing a sacrificial oxide layer over the second structure to form a third structure; planarizing the third structure; removing the sacrificial oxide layer to form a fourth structure; depositing a switching layer material over the fourth structure to form a fifth structure; depositing a second electrode layer over the fifth structure to form a sixth structure; and etching the sixth structure to form a seventh structure.

Example 19 includes the subject matter of claim 18, wherein the seventh structure includes a non-planar resistive memory cell.

Example 20 includes the subject matter of any of claims 18-19, wherein the seventh structure includes a non-planar resistive random-access memory (ReRAM) cell.

Example 21 includes the subject matter of any of claims 18-20, wherein one or more of the depositions include a conformal deposition process.

Example 22 includes the subject matter of any of claims 18-21, further comprising depositing an oxygen exchange layer (OEL) over the fifth structure before depositing the second electrode layer.

Example 23 includes the subject matter of any of claims 18-22, further comprising electrically grounding the first electrode and electrically connecting the second electrode to a voltage source.

Example 24 includes the subject matter of any of claims 18-21, further comprising depositing an oxygen exchange layer (OEL) over the fourth structure prior to depositing the switching layer material.

Example 25 includes the subject matter of any of claim 18-21 or 24, further comprising electrically grounding the second electrode and electrically connecting the first electrode to a voltage source.

Example 26 includes the subject matter of any of claims 18-25, further comprising electrically connecting one of the first and second electrodes to a transistor to form a one transistor-one resistor (1T1R) architecture.

Example 27 includes the subject matter of any of claims 18-25, further comprising electrically connecting one of the first and second electrodes to a diode to form a one diode-one resistor (1D1R) architecture.

Example 28 is a method of forming an integrated circuit, the method comprising: etching a region in a substrate to form a first structure; depositing a first electrode layer over the first structure to form a second structure; etching the second structure to form a third structure, wherein the third structure includes first electrode spacers on side walls of the etched region in the substrate; depositing a switching layer material over the third structure to form a fourth structure; etching the fourth structure to form a fifth structure, wherein the fifth structure includes switching layer material substantially adjacent to the first electrode spacers; depositing a second electrode layer over the fifth structure to form a sixth structure; and planarizing the sixth structure to form a seventh structure.

Example 29 includes the subject matter of claim 28, wherein the seventh structure includes a non-planar resistive memory cell.

Example 30 includes the subject matter of any of claims 28-29, wherein the seventh structure includes a non-planar resistive random-access memory (ReRAM) cell.

Example 31 includes the subject matter of any of claims 28-30, further comprising: depositing an oxygen exchange layer (OEL) over the third structure, prior to depositing the switching layer material, to form a first intermediate structure; and etching the first intermediate structure, prior to depositing the switching layer material, to form a second intermediate structure, wherein the second intermediate structure includes an OEL on the first electrode spacers.

Example 32 includes the subject matter of any of claims 28-31, further comprising electrically grounding the first electrode and electrically connecting the second electrode to a voltage source.

Example 33 includes the subject matter of any of claims 28-30, further comprising:

depositing an oxygen exchange layer (OEL) over the fifth structure, prior to depositing the second electrode layer, to form a first intermediate structure; and etching the first intermediate structure, prior to depositing the second electrode layer, to form a second intermediate structure, wherein the second intermediate structure includes an OEL on the switching layer material.

Example 34 includes the subject matter of any of claim 28-30 or 33, further comprising electrically grounding the second electrode and electrically connecting the first electrode to a voltage source.

Example 35 includes the subject matter of any of claims 28-34, wherein one or more of the depositions include a conformal deposition process.

Example 36 includes the subject matter of any of claims 28-35, wherein one or more of the etches include a blanket etch process.

Example 37 includes the subject matter of any of claims 28-36, further comprising electrically connecting one of the first and second electrodes to a transistor to form a one transistor-one resistor (1T1R) architecture.

Example 38 includes the subject matter of any of claims 28-36, further comprising electrically connecting one of the first and second electrodes to a diode to form a one diode-one resistor (1D1R) architecture.

The foregoing description of example embodiments has been presented for the purposes of illustration and description. It is not intended to be exhaustive or to limit the present disclosure to the precise forms disclosed. Many modifications and variations are possible in light of this disclosure. It is intended that the scope of the present disclosure be limited not by this detailed description, but rather by the claims appended hereto. Future filed applications claiming priority to this application may claim the disclosed subject matter in a different manner, and may generally include any set of one or more limitations as variously disclosed or otherwise demonstrated herein.

What is claimed is:

1. An integrated circuit, comprising:
   a first interlayer dielectric (ILD) layer including a first electrically conductive interconnect feature;
   a second ILD layer above the first ILD layer and including second and third electrically conductive interconnect features, the second and third electrically conductive interconnect features being laterally adjacent to one another;
   a first electrode on opposing trench walls of a trench in the first ILD layer, the trench being laterally adjacent to the first electrically conductive interconnect feature, the first electrode including one or more metals, at least one of the one or more metals being in direct contact with the opposing trench walls;
   a second electrode at least partially in the trench;
   a switching layer between the first and second electrodes and at least partially in the trench, the switching layer configured to switch between two different states; and
   an oxygen exchange layer (OEL) over the switching layer, the OEL extending above the trench;
   wherein the second electrode is between opposing portions of the switching layer,
   wherein the trench has a height to width ratio of at least 2 to 1, and
   wherein at least one of the second and third interconnect features in the second ILD layer is electrically coupled to at least one of the first electrode and the second electrode.

2. The integrated circuit of claim 1, wherein the first electrode is adjacent to at least two sides of the switching layer.

3. The integrated circuit of claim 1, wherein each of the first electrode, the switching layer, and the second electrode are completely within the trench.

4. The integrated circuit of claim 1, wherein the first electrode is electrically connected to a voltage source and the second electrode is electrically grounded.

5. The integrated circuit of claim 1, wherein the first electrode is electrically grounded and the second electrode is electrically connected to a voltage source.

6. The integrated circuit of claim 1, wherein the first and second electrodes comprise at least one of copper (Cu), tungsten (W), titanium (Ti), nitrogen with sulfur or titanium or tantalum, or one or more noble metals.

7. The integrated circuit of claim 1, wherein the first and second electrodes each have a thickness in the range of 5-100 nanometers.

8. The integrated circuit of claim 1, wherein the switching layer comprises oxygen and one or more metals.

9. The integrated circuit of claim 1, wherein the switching layer has a thickness in the range of 2-10 nanometers.

10. The integrated circuit of claim 1, wherein the oxygen exchange layer (OEL) is at least partially between the switching layer and one of the first and second electrodes.

11. The integrated circuit of claim 1, wherein the OEL comprises at least one of hafnium (Hf), titanium (Ti), or tantalum (Ta).

12. The integrated circuit of claim 1, wherein the OEL has a thickness in the range of 2-10 nanometers.

13. The integrated circuit of claim 1, wherein the first and second electrodes are part of a non-planar resistive memory cell, and an effective area of the cell is increased by at least double compared to a planar resistive memory cell occupying same space.

14. The integrated circuit of claim 1, wherein the first and second electrodes are part of a non-planar resistive memory cell, and at least the portion of the non-planar resistive memory cell within the trench has a height to width ratio of at least 5 to 1.

15. The integrated circuit of claim 1, wherein one of the first and second electrodes is electrically connected to a transistor in a one transistor—one resistor (1T1R) architecture.

16. The integrated circuit of claim 1, wherein one of the first and second electrodes is electrically connected to a diode in a one diode—one resistor (1D1R) architecture.

17. Resistive random-access memory (ReRAM) comprising the integrated circuit of claim 1.

18. The integrated circuit of claim 8, wherein the one or more metals includes at least one of hafnium, titanium, tungsten, tantalum, zirconium, vanadium, copper, or aluminum.

19. An integrated circuit, comprising:
   a first electrode on opposing trench walls of a trench in a structure, the structure including dielectric material, the structure also including one or more interconnect features;
   a second electrode at least partially in the trench;
   a switching layer between the first and second electrodes and at least partially in the trench, the switching layer including oxygen and one or more metals; and
   an oxygen exchange layer (OEL) between the switching layer and one of the first and second electrodes, the OEL extending above the trench;
   wherein the second electrode is between opposing portions of the switching layer.

20. The integrated circuit of claim 19, wherein the OEL includes at least one of hafnium, titanium, or tantalum.

21. An integrated circuit, comprising:
   a first electrode on opposing walls of a trench, the first electrode including one or more metals, at least one of the one or more metals being in direct contact with the opposing trench walls;
   a second electrode at least partially in the trench, the second electrode including one or more metals;
   a switching layer between the first and second electrodes and at least partially in the trench, the switching layer including oxygen and one or more metals; and
   an oxygen exchange layer (OEL) between the switching layer and one of the first and second electrodes, the OEL extending above the trench;
   wherein the second electrode is between opposing portions of the switching layer, and
   wherein the trench has a height to width ratio of at least 2 to 1.

* * * * *